US010365670B2

(12) United States Patent
Swint et al.

(10) Patent No.: US 10,365,670 B2
(45) Date of Patent: Jul. 30, 2019

(54) VARIABLE THERMAL RESISTANCE

(71) Applicant: Massachusetts Institute of Technology, Cambridge, MA (US)

(72) Inventors: Reuel B. Swint, Billerica, MA (US); Gregory D. Allen, Somerville, MA (US); Todd A. Thorsen, Carlisle, MA (US); Boris G. Kharas, Needham, MA (US); Donna-Ruth Webb Yost, Acton, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 309 days.

(21) Appl. No.: 15/416,498

(22) Filed: Jan. 26, 2017

(65) Prior Publication Data

US 2018/0095481 A1    Apr. 5, 2018

Related U.S. Application Data

(60) Provisional application No. 62/313,217, filed on Mar. 25, 2016.

(51) Int. Cl.
*F28F 27/00* (2006.01)
*G05D 23/01* (2006.01)
(Continued)

(52) U.S. Cl.
CPC ............. *G05D 23/01* (2013.01); *F28D 15/00* (2013.01); *F28D 21/00* (2013.01); *F28F 13/00* (2013.01);
(Continued)

(58) Field of Classification Search
CPC ....... G05D 23/01; G05D 23/121; F28F 13/00; F28F 2013/008; H05K 7/20254;
(Continued)

(56) References Cited

U.S. PATENT DOCUMENTS 4,051,890 A * 10/1977 Melchior ............... F24J 2/04
                                                                            126/569
4,274,476 A *  6/1981 Garrett .................. F28D 15/06
                                                                            165/272
(Continued)

OTHER PUBLICATIONS

Kim, H.S., et al., "Design and Verification of a Low-Powered Pre-Programmable In-Package Temperature Controller," Proceedings of IMECE2006, 2006 ASME International Mechanical Engineering Congress and Exposition, (IMECE2006-15136), 7 pages, Nov. 5-10, 2006.

(Continued)

*Primary Examiner* — David D Hwu
(74) *Attorney, Agent, or Firm* — Hamilton, Brook, Smith & Reynolds, P.C.

(57) ABSTRACT

Electrical and electromechanical devices often require maintaining a specific temperature, or a narrow range or temperatures, during operation. An assembly regulates the temperature of a device by providing a variable thermal resistance between the device and a heatsink. The device can be mounted to a base having a high thermal resistance, the base thermally isolating the device from the heatsink. At low environmental temperatures, the base enables the device to rise to its operating temperature as a result of the device's waste heat, and with no or minimal use of a heater. As the environmental temperature increases, a working fluid, having a low thermal resistance, undergoes thermal expansion to fill a portion of a volume in the base between the device and the heat sink, lowering the thermal resistance between the device and the heatsink to maintain the device at the required operating temperature.

35 Claims, 9 Drawing Sheets

(51) Int. Cl.
*H05K 7/20* (2006.01)
*F28D 15/00* (2006.01)
*F28F 13/00* (2006.01)
*F28D 21/00* (2006.01)
*G05D 23/12* (2006.01)

(52) U.S. Cl.
CPC ........... *G05D 23/121* (2013.01); *H05K 7/205* (2013.01); *H05K 7/20254* (2013.01); *F28D 2021/0029* (2013.01); *F28F 2013/008* (2013.01)

(58) Field of Classification Search
CPC ......... H05K 7/205; F28D 15/06; F28D 15/00; F28D 21/00; F28D 2021/0029; F24J 2/04
USPC ........................................................ 165/276
See application file for complete search history.

(56) References Cited

U.S. PATENT DOCUMENTS

| | | | |
|---|---|---|---|
| 4,454,910 A * | 6/1984 | Miyazaki | F28F 13/00 165/276 |
| 4,706,740 A | 11/1987 | Mahefkey | |
| 6,175,495 B1 | 1/2001 | Batchelder | |
| 6,517,221 B1 | 2/2003 | Xie | |
| 7,299,859 B2 | 11/2007 | Bolle et al. | |

OTHER PUBLICATIONS

Laws, A. D., et al., "Thermal Conduction Switch for Thermal Management of Chip Scale Atomic Clocks," (IMECE2006-14540), Journal of Electronic Packaging, vol. 130, 6 pages, Jun. 2008.

\* cited by examiner

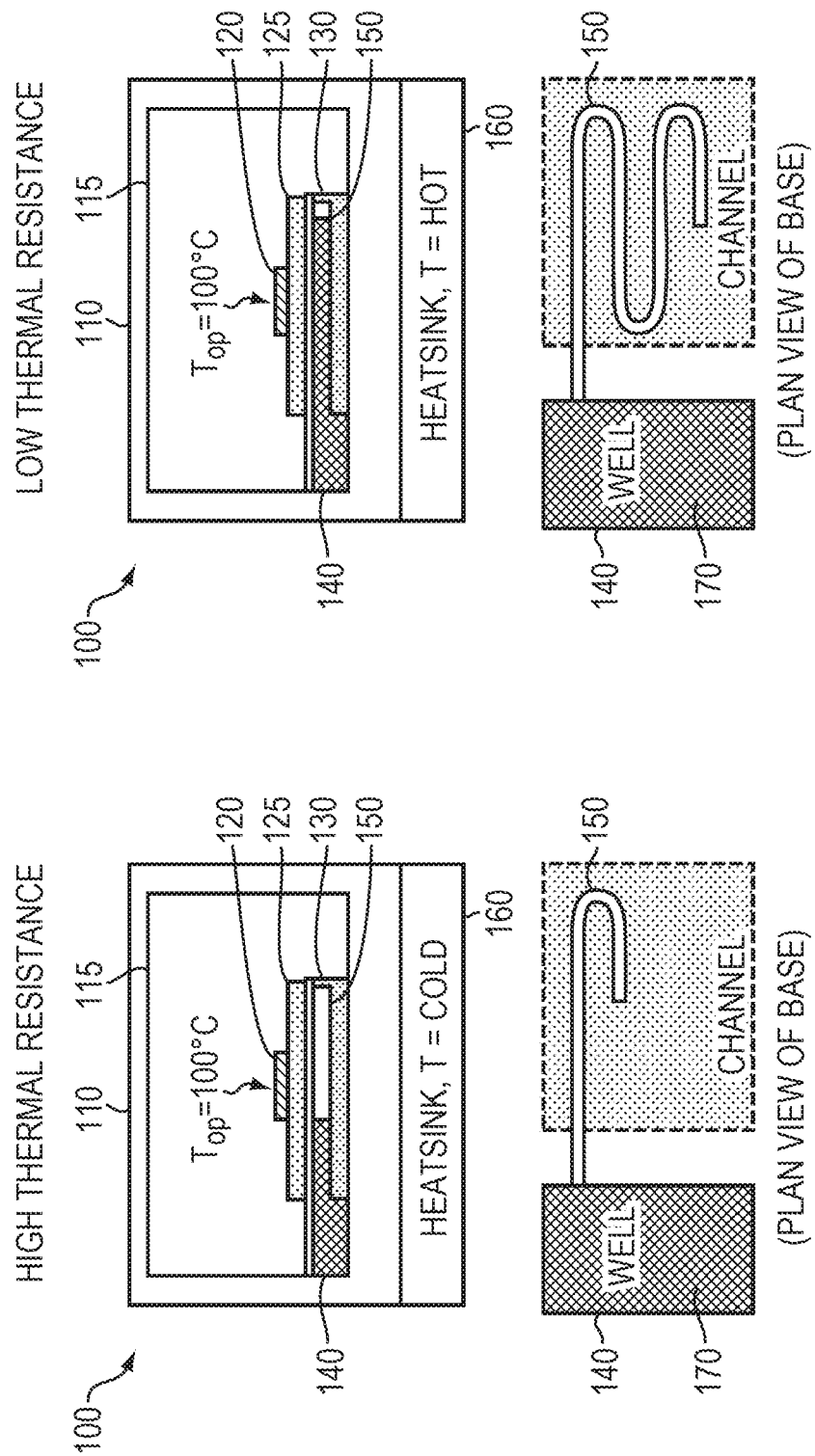

VARIABLE THERMAL RESISTANCE

RELATED APPLICATION

This application claims the benefit of U.S. Provisional Application No. 62/313,217, filed on Mar. 25, 2016. The entire teachings of the above application are incorporated herein by reference.

GOVERNMENT SUPPORT

This invention was made with government support under Contract No. FA8721-05-C-0002 awarded by the U.S. Air Force. The government has certain rights in the invention.

BACKGROUND

Many electronic devices exhibit performance that is dependent on the temperature of the device. In particular, the characteristics of some oscillators and sensors are a function of temperature, where even a small change in temperature may alter their performance outside acceptable parameters. Due to such temperature sensitivity, these devices must be stabilized at a predetermined temperature to maintain proper functionality. Because cooling is energy intensive as well as costly and complex to implement, low-power applications require that a temperature-sensitive device be stabilized at a temperature above the maximum environmental temperature expected during operation. Such a configuration allows the device to be stabilized at the required temperature by applying only heating, rather than heating and cooling, to the device. When the environmental temperature is high, only a small amount of heater power (e.g., the waste heat of the device) may be utilized to increase the device temperature up to its predesigned operating temperature. When the environmental temperature is low, additional heat is required to maintain the device at the operating temperature.

SUMMARY OF THE INVENTION

Example embodiments of the present invention include an apparatus for regulating temperature, the apparatus including a mount, a heatsink, and a base. The mount may accept a device on a surface thereon. The base defines a well therein configured to contain a working fluid. The base also defines a channel disposed in a thermally conductive path between the mount and the heatsink, where the channel is in liquid communication with the well. The well and channel may be sized to enable the working fluid to expand passively from the well into the channel and contract passively from the channel into the well in continuous amounts, where the amounts are a function of a temperature of the heatsink.

In further embodiments, the thermally conductive path may have a thermal resistance that varies in a substantially linear relation to the temperature of the heatsink, where the thermal resistance is a function of the amount of working fluid in the channel. The thermal resistance of the thermally conductive path may vary in a manner that enables the mount to maintain a substantially constant temperature while the temperature of the heatsink fluctuates. The constant temperature maintained at the mount, in turn, may maintain the mounted device at a constant temperature. As a result, a temperature-sensitive device can be maintained at a given temperature or within a given temperature range.

In still further embodiments, the heatsink may absorb heat from, or conduct heat to, an external environment, where the temperature of the heatsink varies based on a temperature of the external environment. The working fluid may possess a higher positive coefficient of thermal expansion than the base at least at the well and channel. For example, the coefficient of thermal expansion of the fluid may be at least 1% greater than that of the base over a temperature range of −40° C. to 85° C.

In yet further embodiments, a support structure may be disposed in the thermally conductive path securing the mount to the base. The support structure may have a high thermal resistance relative to a thermal resistance of the working fluid. The mount and heatsink may be thermally isolated but for the support structure and the channel. The support structure may be configured to form walls of at least two sides of the channel. The support structure may also encapsulate the channel at all sides, thereby forming a capillary enclosed in the support structure. Alternatively, the channel may be at least partially unbounded on at least two sides, the channel maintaining the working fluid within the at least two sides based on a surface tension of the working fluid.

In yet still further embodiments, the apparatus may further include an enclosure containing the mount and the device within an internal volume, where the internal volume may have a high thermal resistance relative to a thermal resistance of the working fluid. For example, the internal volume may be a vacuum. Further still, the base may define a vent in liquid communication with the channel, where the vent may be configured to receive a portion of the working fluid in response to the working fluid's crossing a threshold pressure within the channel.

In further embodiments, the base may define the channel as a plurality of separate paths (also referred to as branches) extending from the well, each of the branches being configured to receive a portion of the working fluid concurrently or in succession. The apparatus may further include a heater device configured to selectively apply heat to the device based on a detected temperature of the device. Such a heater device may be integrated into the device itself, or mounted proximate to the mount or the heatsink, and may include a temperature sensor, a heating element, and a control circuit. Further still, some or all of the apparatus, including the mount and base, may be produced by a Microelectromechanical systems (MEMS) manufacturing process.

Example embodiments may further include an apparatus for regulating temperature, the apparatus including a mount, a heatsink, and a base. The base may define a passive capillary and well system thermally disposed between the mount and heatsink and containing therein a working fluid that variably thermally couples the mount to the heatsink as a function of a temperature of the heatsink and enables the mount to maintain a substantially constant temperature while the heatsink fluctuates as a function of its surrounding environment.

Example embodiments may further include a method of regulating temperature. A working fluid may be stored in a well. The working fluid may be enabled to expand from the well into a channel in response to an increase in a temperature of a heatsink, where the channel may be disposed in a thermally conductive path between a mount and the heatsink, the channel receiving an amount of the working fluid as a function of the temperature of the heatsink. The working fluid may further be enabled to contract from the channel into the well in response to a decrease in the temperature of the heatsink.

In further embodiments of the method described above, enabling the working fluid to expand and contract may cause the thermally conductive path to have a thermal resistance that varies in a substantially linear relation to the temperature of the heatsink. Enabling the working fluid to expand and contract causes the thermally conductive path to have a thermal resistance that varies in a manner causing the mount to maintain a substantially constant temperature while the temperature of the heatsink fluctuates. The heatsink may absorb heat from, or conduct heat to, an external environment, the temperature of the heatsink varying based on a temperature of the external environment.

In still further embodiments, the mount and the heatsink may be thermally isolated but for the thermally conductive path. The mount and the device may be enclosed within an internal volume, the internal volume having a high thermal resistance relative to a thermal resistance of the working fluid. The working fluid may be enabled to enter a vent in response to the working fluid crossing a threshold pressure within the channel.

Example embodiments may further include an apparatus for regulating temperature. The apparatus may include means for storing a working fluid in a well, as well as means for enabling the working fluid to expand from the well into a channel in response to an increase in a temperature of a heatsink and contract from the channel into the well in response to a decrease in the temperature of the heatsink, the channel being disposed in a thermally conductive path between a mount and the heatsink, the channel receiving an amount of the working fluid as a function of the temperature of the heatsink.

Example embodiments may further include a method of manufacturing an apparatus for regulating temperature. The method may include forming, within a substrate, a mount, a well, and a channel. The mount may be configured to be coupled to a device. The well may be configured to contain a working fluid. The channel may be formed to be disposed in a thermally conductive path between the mount and a heatsink, the channel in liquid communication with the well. The channel and well may be sized to enable the working fluid to expand passively into the channel and contract passively from the channel in continuous amounts, the channel receiving an amount of the working fluid as a function of a temperature of the heatsink. The substrate may include a silicon substrate.

Example embodiments may further include a product prepared by a process. The process may include forming a mount within a substrate, forming a well within the substrate, filling the well with a working fluid, and forming a channel within the substrate. The channel may be disposed in a thermally conductive path between the mount and a heatsink, the channel being in liquid communication with the well. The channel and well may be sized to enable the working fluid to expand passively into the channel and contract passively from the channel in continuous amounts, where the channel receives an amount of the working fluid as a function of a temperature of the heatsink. The substrate may include a silicon substrate.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

FIGS. 1A and 1B illustrate an apparatus for regulating the temperature of a device.

DETAILED DESCRIPTION OF THE INVENTION

Figure 2A:
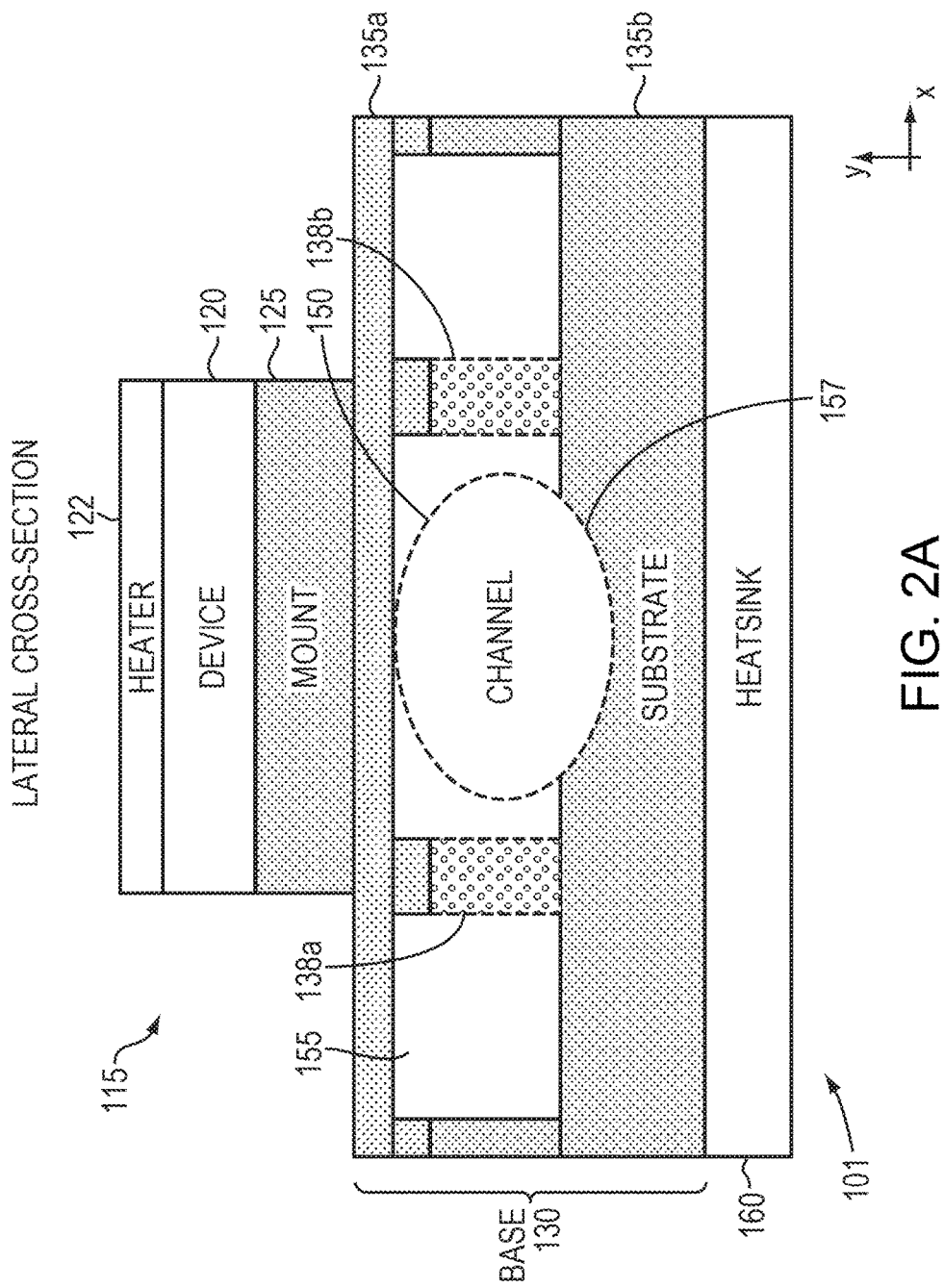
FIGS. 2A and 2B illustrate a subassembly of an example embodiment, such as that of FIGS. 1A and 1B, in further detail.

A description of example embodiments of the invention follows.

Common electronic or electromechanical devices are thermally coupled to a heatsink in order to transfer waste heat from the device to the heatsink, where the waste heat is generated by the operation of the device. For devices that must operate at a preset operating temperature $T_{op}$, a heater may also be thermally coupled (or integral to) the device to ensure the operating temperature is maintained. The preset operating temperature $T_{op}$ may be higher than the maximum temperature of the expected operating environment, thereby allowing the heater to maintain the operating temperature without the need for a cooling device. Given an operating temperature $T_{op}$ that is higher than a given environmental temperature $T_{env}$, the amount of heater power P required to maintain the device at the preset operating temperature $T_{op}$ under the environmental temperature $T_{env}$ is described by the following equation:

$$P = (T_{op} - T_{env})/R_{th} \qquad (1)$$

$R_{th}$ is the thermal resistance between the device and the heatsink at the environmental temperature $T_{env}$. In many applications, a device can be implemented in a wide range of different or variable environments such that the environmental temperature variance can be quite large (e.g., −55° C. to 80° C.), and the required heater power at low environmental temperatures can become extremely large, dominating the power requirements of the system. Large environmental temperature excursions are common in automotive, industrial, aerospace, satellite, and military applications.

An example of a device that benefits from a variable thermal resistance (VTR) is the diode laser in a chip-scale atomic clock, which is intended to be utilized in power-constrained applications in widely varying temperature environments. The laser wavelength is a sensitive function of temperature and must be locked to an atomic absorption line by controlling the laser temperature. The waste heat of the laser limits the maximum thermal resistance between the laser and the heatsink (too high a thermal resistance would cause the laser to overheat), and power constraints limit the amount of power that can be used for temperature control.

Previous techniques for regulating the temperature of a device include providing a bimetallic cantilever or a single-element bimetallic switch, which are switched into and out of contact with the device as a function of temperature, thereby changing the thermal resistance between the device and a heatsink. Such techniques may affect the temperature of the device. However, bimetallic switches are limited in the contact pressure that they are capable of developing, which is necessary to effect sufficient thermal contact, and the temperature at which they actuate depends upon whether the environmental temperature is rising or falling. Further, the switches, being largely binary in nature, lack granularity in the change in thermal resistance. As a result, bimetallic switches can fail to maintain a device at a required operating temperature over a range of environmental temperatures.

Example embodiments of the present invention provide a variable thermal resistance (VTR) between the device and the heatsink. The VTR may vary based on the temperature of the device, the heatsink, and/or the environment. For example, the VTR may change in direct proportion to the differential temperature between the device and the environment. This variable thermal resistance may be realized with a powered actuator (e.g. by using a motor to increase the separation between the device and the heatsink), or it may be realized passively (e.g. by taking advantage of a material's thermal expansion to increase and decrease the separation between the device and the heatsink). The VTR may be implemented in conjunction with, or in place of, a powered heater to maintain the device at the operating temperature. If implemented with a heater, the heater may operate a small, constant power value, rather than at a variable power value that is dependent on the environmental temperature. Example embodiments can provide a passive, continuously variable, non-hysteretic variable thermal resistance with a high dynamic range (e.g., a ratio of 10:1) to regulate the temperature of a device, and can maintain the device at a required operating temperature.

FIGS. 1A and 1B illustrate an apparatus 100 for regulating the temperature of a device 120. The apparatus 100 may include an enclosure 110 housing several components within an internal volume 115, including the device 120, a device mount 125, and a base 130. The internal volume 115 may include a vacuum, or may include a gas or other substance having a high thermal resistance, such that the device 120 is substantially thermally isolated but for the device mount 125. In alternative embodiments, the enclosure 110 and/or internal volume 115 may be omitted or replaced with a different, suitable packaging.

The device 120 may include one or more electrical or electromechanical devices, such as a diode laser, oscillator, or sensor, and, particularly, may include devices having a required operating temperature $T_{op}$ or a narrow operating temperature range. In the example shown in FIG. 1, the device 120 has an operating temperature $T_{op}$ of 100° C. The device 120 may be mounted and thermally coupled to the mount 125 such that the temperature of the device 120 and mount 125 are equalized. The mount 125, in turn, may be mounted to the base 130. The base may be thermally coupled to a heatsink 160, for example, by being directly coupled to the heatsink 160, or by being coupled to the heatsink 160 via a portion of the enclosure 110 as shown. In such a configuration, the portion of the enclosure 110 may have a high thermal conductivity, providing a thermally conductive channel between the base 130 and the heatsink 160.

Under previous device assemblies, a device would be installed such that it is thermally coupled to a heatsink, with a constant low thermal resistance between the device and heatsink. For example, the device may be mounted directly to the heatsink, or to a thermally conductive mount that is coupled to the heatsink. Such a configuration allows the device to transfer, with minimal resistance, waste heat resulting from device operation to the heatsink. Although this transfer of waste heat away from the device can prevent the device from overheating, if the required operating temperature of the device is substantially higher that of the environment, a heater may be needed to maintain the device at the operating temperature.

In the apparatus 100, in contrast, the base 130 may be configured within the thermally conductive path between the device 120 and the heatsink 160. Given a high device operating temperature (e.g., $T_{op}$=100° C.) relative to the highest expected environmental temperature (e.g., 80° C.), waste heat generated by the device 120 during operation would be expected to migrate toward the heatsink 160 under all environmental temperatures. However, the base 130 exhibits a variable thermal resistance (VTR) within this path, thereby modifying the quantity of waste heat that is transferred from the device 120 to the heatsink 160.

In particular, at a low environmental temperature (e.g., −40° C.), as shown in FIG. 1A, the heatsink 160 may have the same or a similar low temperature. In response, the base 130 may exhibit a high thermal resistance, which enables the device 120 to maintain its operating temperature $T_{op}$ by trapping some or substantially all of the device's waste heat at the device 120 and mount 125. In contrast, at a high environmental temperature (e.g., 80° C.), as shown in FIG. 1B, the heatsink 160 may have the same or a similar high temperature. In response, the base 130 may exhibit a low thermal resistance, which enables the device 120 to maintain its operating temperature $T_{op}$ by transferring some or substantially all of the device's waste heat to the heatsink 160. Under both low and high environmental temperatures, a heater device (not shown) may be implemented to apply a relatively small amount of heat to the device, as a supplement to the heat generated by the device 120, to ensure the operating temperature is maintained. An example heater is described in further detail below with reference to FIGS. 2A-B.

The base 130 may exhibit the aforementioned VTR by including a well 140 and a channel 150, which are shown in further detail in the plan views of FIGS. 1A-B. The well 140 may contain a volume of a working fluid 170, and is in liquid communication with the channel 150. The working fluid 170 may exhibit a high thermal conductivity and a relatively high coefficient of thermal expansion (e.g., approximately 2% relative to the coefficient of thermal expansion of the base (e.g., a silicon substrate) over a temperature range of −40° C. to 85° C.). The majority of the working fluid 170 may be maintained in the well 140 under all conditions, where the well 140 is positioned outside of the thermally conductive path between the device 120 and the heatsink 140. The channel 150, in contrast, extends through this thermally conductive path, and may generally encompass a substantial vacuum. Alternatively, the channel 150 may encompass a gas or a fluid (not shown) having a high thermal resistance.

The well 140 may be positioned in thermal communication with the heatsink 160. For example, the well 140 and heatsink may be coupled to opposing surfaces of a segment of the enclosure 110 as shown, or the portion of the base 130 defining the well 140 may be directly coupled to the heatsink 160. The capillary 150, as described above, is also in thermal communication with the heatsink 160 due to its position in the thermally conductive path between the device 120 and the heatsink 160. As a result, the working fluid 170 in the well 140 may exhibit a temperature that is a function of the temperature of the heatsink 160 and, in turn, the temperature of the external environment to which the heatsink 160 may be exposed. Depending on the aforementioned thermal communication, the temperature of the working fluid 170 in the well 140 may be similar to the temperature of the heatsink 160.

Due to thermal expansion, as the temperature of the working fluid 170 rises, the volume of the working fluid 170 also rises, causing it to expand from the well 140 into at least a portion of the channel 150. The well 140 may contain a large volume of the working fluid 170 relative to the volume of the channel 150. As a result, the difference in volume of the working fluid 170 over a given temperature range (e.g., the expected environmental temperature), may be sufficient to occupy a substantial portion of the volume of the channel 150. Thus, the working fluid 170 may expand and contract to occupy a range of volumes within the channel 150 over the given temperature range.

An example of such thermal expansion, as well as its effect on the VTR of the base 130, is illustrated in FIGS. 1A-B. As shown in FIG. 1A, due to the heatsink 160 exhibiting a relatively cold temperature, the working fluid 170 occupies the well 140 and extends into a small portion of the channel 150. Alternatively, the working fluid 170 may occupy only the well 140, and be completely evacuated from the channel 150, at low temperatures. Because the channel 150 encompasses a vacuum at this state, the base 130 exhibits a high thermal resistance with regard to the thermally conductive path between the device 120 and the heatsink 160. As a result, a greater portion of the heat generated by the device 120 may be retained at the device 120, where it can be used to maintain the device's operating temperature.

In contrast, as shown in FIG. 1B, the heatsink 160 exhibits a higher temperature, causing the temperature of the working fluid 170 in the well 140 to rise. Due to thermal expansion, this rise in temperature causes the working fluid 170 to expand and, constrained by the volume of the well 140, extend into the channel 150. As the channel 150 fills with the working fluid 170, the vacuum, having a high thermal resistance, is replaced by the working fluid 170, having a lower thermal resistance. This change, in turn, lowers the thermal resistance of the portion of the base 130 in the thermally conductive path between the device 120 and the heatsink 160. As a result, a greater portion of the heat generated by the device 120 may be transferred to the heatsink 160, aiding in cooling the device 120 and enabling the device 120 to maintain its operating temperature under higher environmental temperatures.

Due to the variable thermal expansion and contraction of the working fluid 170 into (and out of) the channel 150 over a given temperature range, the base 130 can provide a passive, continuously variable thermal resistance between the base 120 and heatsink 160, where this VTR is a function of the temperature of the heatsink 160. For example, this function may be a linear relation between temperature and thermal resistance, as described below with reference to FIG. 3. In an alternative embodiment, thermal expansion of the working fluid 170 may be assisted by applying an electro-wetting capillary pump (not shown) to the channel 150, thereby providing active thermal expansion of the working fluid 170.

Figure 2B:
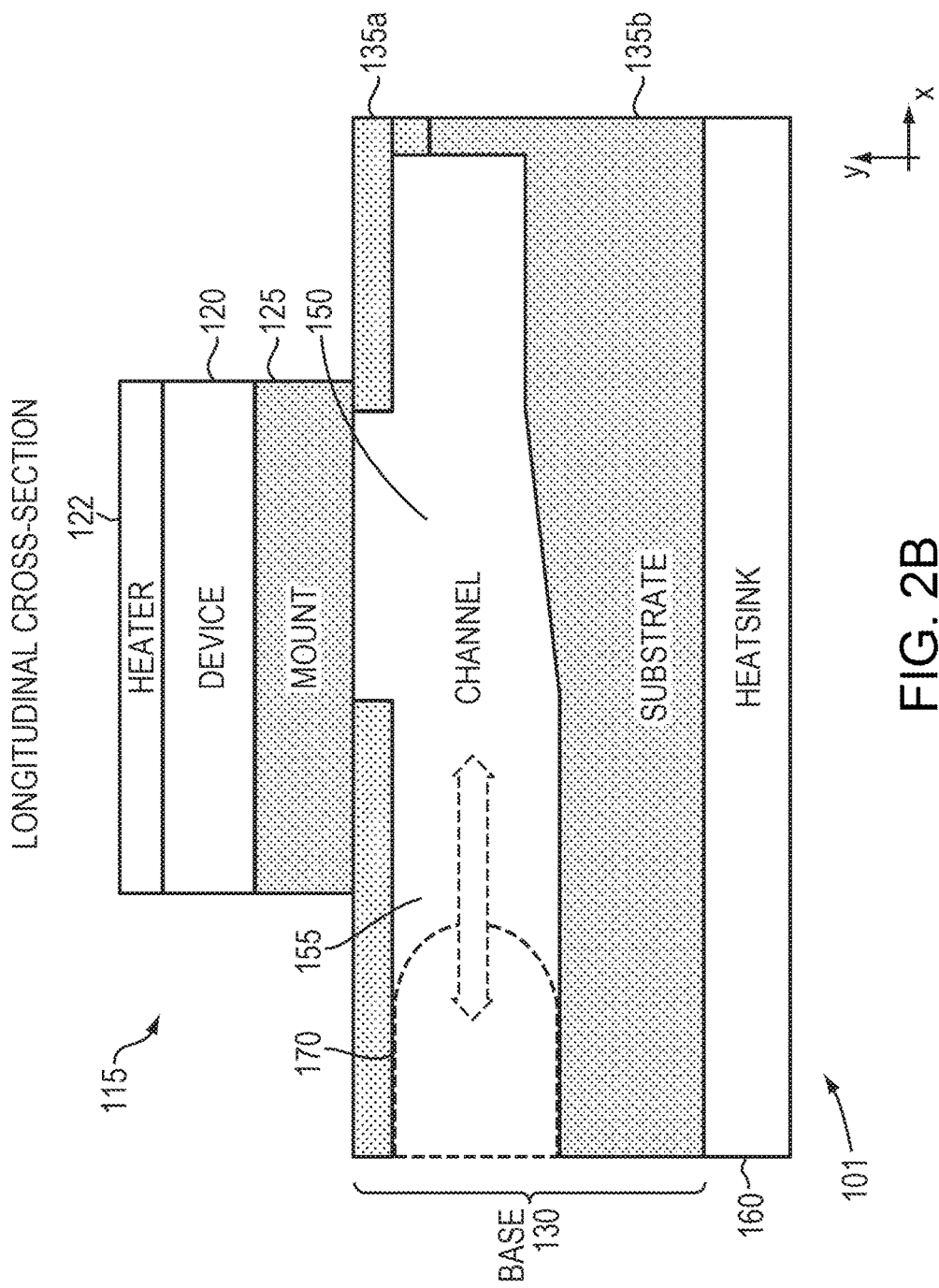

Although the channel 150 as shown in FIGS. 1A-B forms a single path with numerous bends, the channel 150 may take a number of different forms. For example, the channel 150 may form a single, straight path (as shown in FIGS. 2A-B, described below), or may feature a plurality of distinct paths (also referred to as branch) extending from the well 140. Further, the channel 150 may be bounded on all sides by the substrate of the base 130, or may be unbounded on one or more side(s) (as shown also in FIGS. 2A-B). In such an unbounded configuration, the surface tension of the working fluid 170 may assist in maintaining the working fluid 170 within the channel 150. The channel 150 may also be referred to as a capillary.

Mercury may be implemented as the working fluid 170, and is advantageous due to its relatively high thermal expansion coefficient (61 ppm/° C.), high thermal conductivity (8 W/m·K), and high surface tension and hydrophobicity. The surface tension and hydrophobic nature of mercury enables it to be expelled from a glass-walled capillary unless forced in by pressurization. Additionally, mercury is liquid over a wide temperature range (−38° C.-356° C.). Amalgams with thallium or gallium can respectively suppress the freezing point or increase the boiling point. Other liquids may also be suitable for use as the working fluid 170 (e.g., liquid-metal Galinstan) depending upon the application of the apparatus 100.

Thus, the apparatus 100 regulates the temperature of the device 120 by providing a variable thermal resistance, via the base 130, between the device 120 and the heatsink 160. The base thermally isolates the device 120 from the heatsink 160 but for a variably thermally conductive path through a portion of the base 130. At low environmental temperatures, the base 130 enables the device 120 to be brought up to its operating temperature as a result of the device's waste heat. As the environmental temperature increases, the working fluid 170, having a low thermal resistance, undergoes thermal expansion to fill a portion of the channel 150, lowering the thermal resistance between the device 120 and the heatsink 160. Thus, the thermal resistance can be varied as a function of the temperature of the device 120 and/or the heatsink 160, maintaining the device 120 at the required operating temperature with no or minimal assistance from a heater.

The apparatus 100 may provide several advantages over previous approaches to regulating temperature of devices. For example, as described above, the base 130 can provide a high-dynamic range VTR between the device 120 and the heatsink 160. The VTR can be continuously variable and have a substantially linear relation to the temperature of the heatsink 160, enabling the apparatus 100 to maintain the device 120 at a required operating temperature through a range of environmental temperatures. In contrast to the use of a heater, the passive thermal expansion of the working fluid 170 enables the apparatus 100 to provide this thermal regulation passively. A heater may be implemented in the apparatus 100 to provide fine adjustment of the device 120 temperature, rather than primary temperature regulation. Further, the apparatus 100 may be fabricated using a microelectromechanical systems (MEMS) manufacturing process, enabling low-cost, scalable production of the apparatus within a silicon and/or other substrate. Through such a manufacturing process, the apparatus 100 can also be sized to accommodate micrometer-scale devices (e.g., devices having dimensions of 100-500 μm).

FIGS. 2A and 2B illustrate a subassembly 101, which may be implemented in the apparatus 100 described above with reference to FIGS. 1A-B. FIG. 2A illustrates a lateral cross-section of the subassembly 101, while FIG. 2B illustrates a longitudinal cross-section. The subassembly 101 may incorporate one or more features as described above, or may include one or more different features or configurations. The subassembly 101 may include a device 120, mount 125, base 130 and heatsink 160 as described above. Further, a heater 122 may be in thermal communication with the device 120, or may be integrated into the device 120. The heater 122 may include a temperature sensor to monitor the temperature of the device 120, a heating element to apply heat to the device 120, and a control circuit to selectively activate the heating element based on the temperature as detected by the sensor. The heater 122 may be configured to assist in maintaining the device 120 at its required operating temperature. However, due to the VTR provided by the base 130, the heater 122 may only be necessary to apply a relatively small, supplemental quantity of heat to the device 120 in order to maintain its operating temperature.

The base 130 may include a top substrate layer 135a to which the mount 125 may be coupled, as well as a bottom substrate layer 135b which may be coupled to the heatsink 160. If fabricated using a MEMs process, the substrate layers 135a-b may each be fabricated from separate substrate wafers (e.g., silicon wafers), and then bonded to create the base 130. A single substrate layer may constitute both the bottom substrate layer 135b and heatsink 160. The substrate layers 135a-b encompass an internal volume 155 that includes the channel 150. The internal volume may include a vacuum or a fluid having high thermal resistance. As shown in FIG. 1A, the channel 150 is unbounded on its left and right sides, and the bottom substrate 135 includes a trench 157 defining the bottom portion of the channel. This trench 157, as well as the surface tension of the working fluid 170, can maintain the working fluid 170 within the channel 150 as the working fluid 170 expands and contracts. Alternatively, the base may include additional boundaries around the channel 150, thereby forming an enclosed capillary. The base 130 may further include support columns 138a-b to support the device 120 and mount 125. The support columns 138a-b may comprise a material having high thermal resistance, or may be positioned so as to avoid transferring substantial heat between the device 120 and the heatsink 160. Further, the support columns 138a-b may encompass a vacuum, or define or more hollow portions, in order to further minimize heat transfer between the device 120 and heatsink 160 via the columns 138a-b.

As shown in FIG. 2B, the working fluid 170 may expand into the channel 150 as a result of thermal expansion, occupying the internal volume 155 to varying degrees. As the working fluid 170 expands into the internal volume 155 between the device 120 and the heatsink 160, the thermal resistance between the device 120 and the heatsink 160 is lowered in continual amounts. Likewise, as the working fluid 170 contracts as a result of a lower temperature, the working fluid 170 may retreat from the channel 150 and into a well (e.g., the well 140 of FIGS. 1A-B), thereby increasing the thermal resistance between the device 120 and the heatsink 160. In addition to the passive control afforded by thermal expansion of the working fluid 170, in alternative embodiments, electrowetting capillary pumps may be implemented at the channel 150 to dynamically control the response of the channel 150.

Figure 2C:
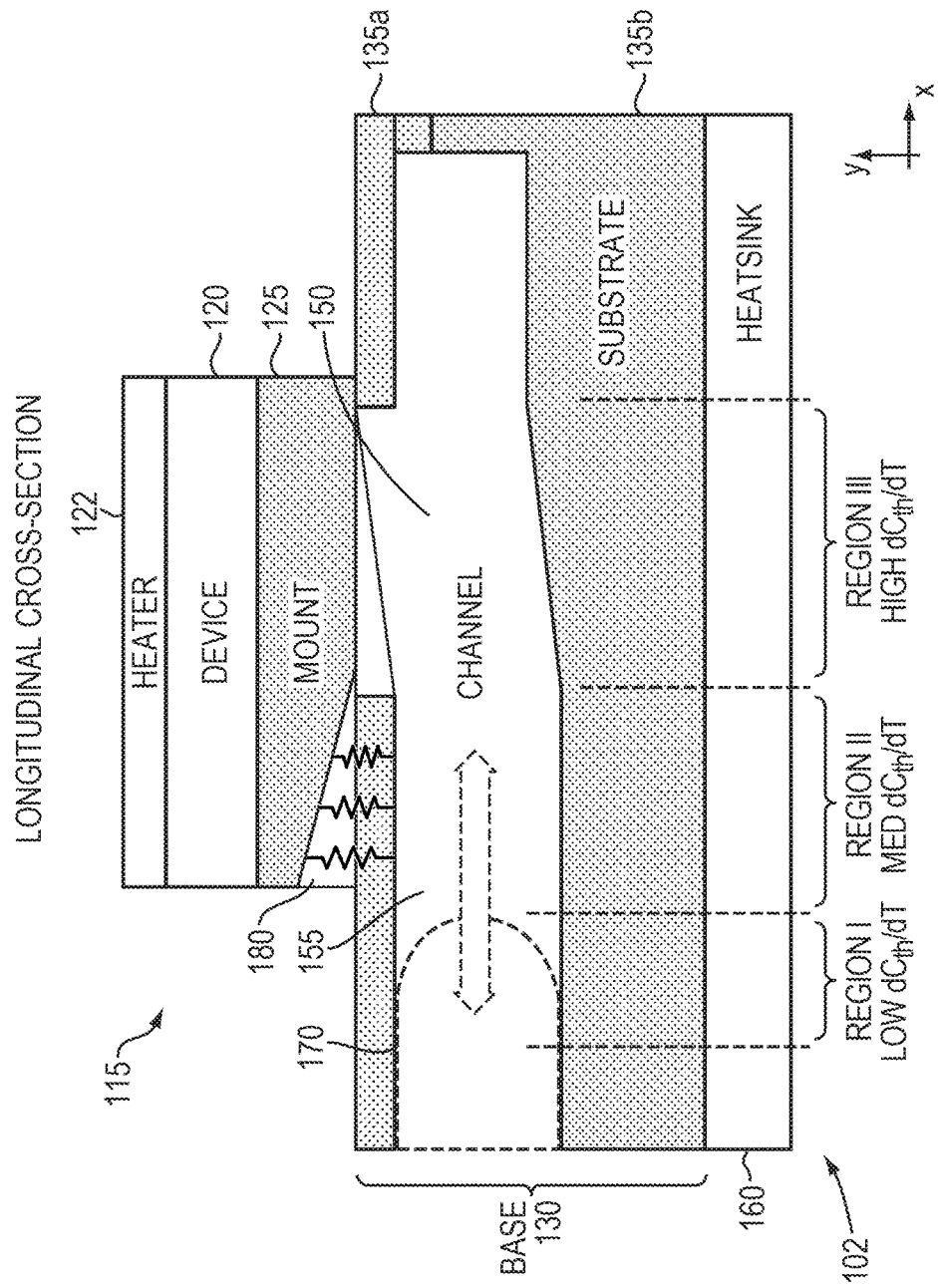
FIGS. 2C and 2D illustrate subassemblies in alternative embodiments.
Figure 2D:
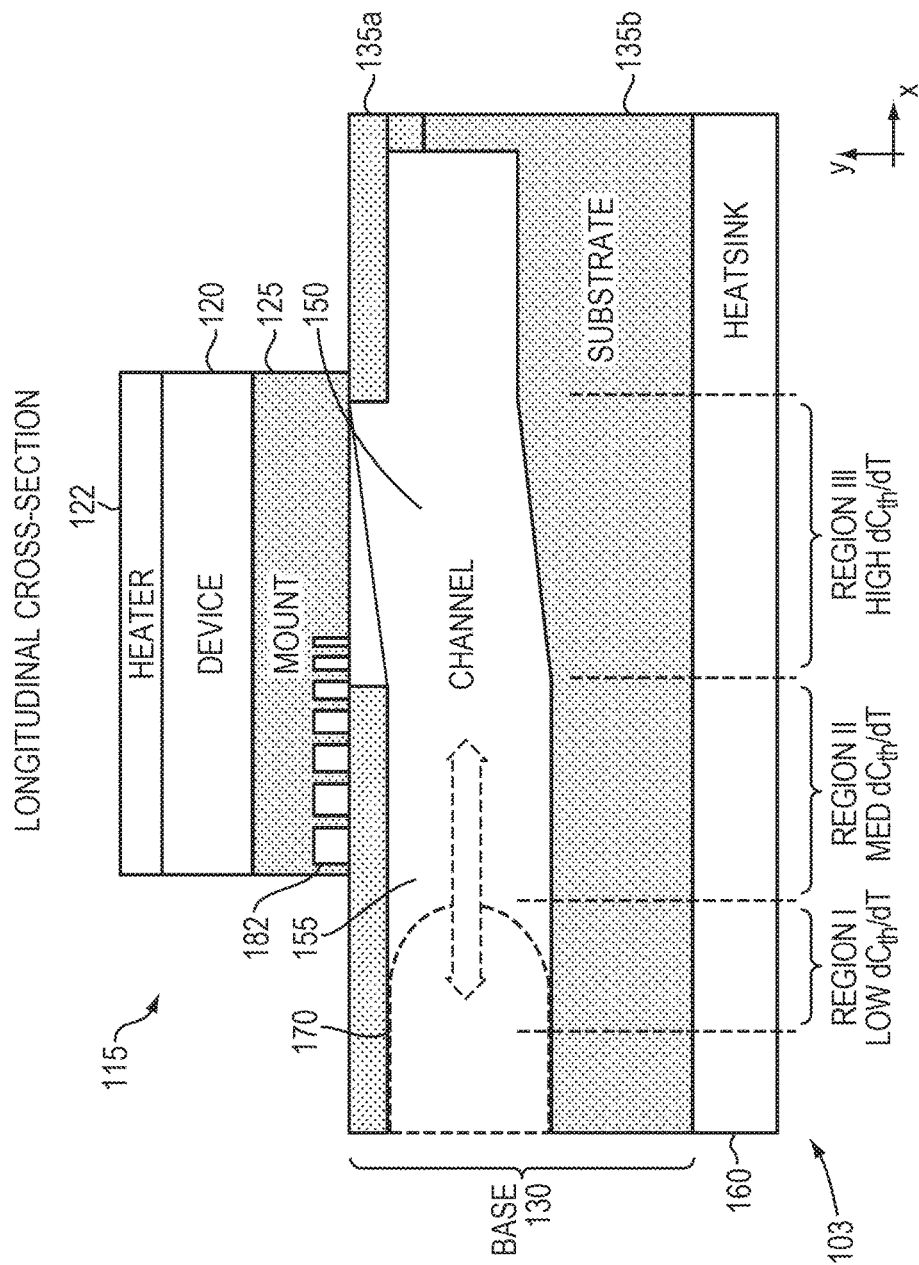

If fabricated under a MEMs process using a silicon substrate, the channel 150 can be patterned directly in the surface of a first silicon wafer (e.g., bottom substrate layers 135b), which may also serve as the heat sink, and a second silicon wafer (e.g., top substrate layer 135a) may be bonded the surface of the first wafer, forming top surface of the channel 150 and the mount 125. The lateral boundary of the channel 150 may be defined by a deeper etch in the silicon surface; the surface tension of the working fluid 170 (e.g., mercury) may prevent it from encroaching into the shallower-etched silicon on either side. Both the first and second wafers may be oxidized and lithographically patterned to modify the thermal resistance along the length of the channel 150. Example embodiments of such configurations are illustrated in FIGS. 2C and 2D, described below. The surfaces of the well 140 and channel 150 can be protected by a thin layer of silicon dioxide ($SiO_2$) to prevent chemical reaction between the silicon and working fluid 170, but would not substantially impede heat flow.

FIGS. 2C and 2D illustrate subassemblies 102 and 103, respectively. The subassemblies 102, 103 may incorporate some or all of the features of the subassembly 101 described above, and may be implemented in the apparatus 100 described above with reference to FIGS. 1A-B. However, the subassemblies 102, 103 each include features providing a gradient in the thermal resistance along the length of the channel 150. In particular, the subassembly 102 includes a wedge 180, which may be an extension of the top substrate layer 135a (or may be a separate element), and is in thermal communication with the mount 125. If the thermal resistance of the wedge 180 is higher than that of the mount 125, then the mount 125, wedge 180 and top substrate layer 135a exhibit a gradient in thermal resistance along the length of the channel 150. Likewise, the subassembly 103 includes a plurality of gaps 182 in the mount 125, which may provide a function comparable to that of the wedge 180 of the subassembly 102. Specifically, the gaps 182 exhibit a higher thermal resistance than the mount 125 itself, resulting the mount 125, gaps 182 and top substrate layer 135a exhibiting a gradient in thermal resistance along the length of the channel 150.

The gradients provided in the subassemblies 102, 103 may be divided by relative thermal resistance, as shown, into region I (low dCth/dT), region II (moderate dCth/dT), and region III (high dCth/dT), where Cth is thermal conductivity (Cth=1/Rth). Further, in region III, the top substrate layer 135a may be decreased in order to further reduce the thermal resistance. Both the dimensions of the wedge 180, gaps 182, and the top substrate layer 135a may be configured such that the VTR has a substantially linear relation to the temperature of the heatsink 160, enabling the subassemblies 102, 103 to maintain the device 120 at a required operating temperature through a range of environmental temperatures.

Figure 3:
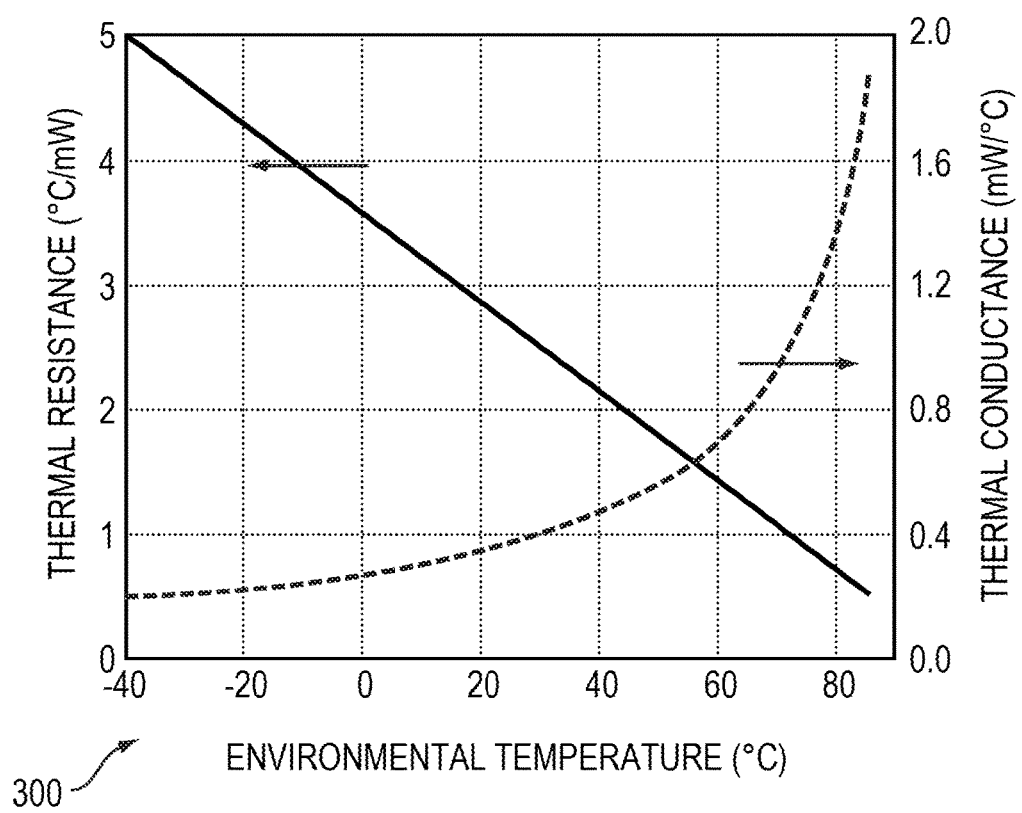
FIG. 3 is a graph illustrating a relation between thermal resistance/conductance and environmental temperature as exhibited by an example embodiment.

FIG. 3 is a graph 300 illustrating a relation between thermal resistance/conductance and environmental temperature, as well as a relation between thermal conductance and environmental temperature, as exhibited by an example embodiment. The environmental temperature, on the X-axis, varies between −40° C. and 85° C. The thermal resistance ($R_{th}$, in ° C./mW, as shown in the left Y-axis), exhibits a linear relation to the environmental temperature, decreasing as the temperature rises. The thermal conductance ($1/R_{th}$, in mW/° C., as shown in the right Y-axis), exhibits a nonlinear relation to the environmental temperature. The apparatus 100 and the subassembly 101, as described above in FIGS. 1A-1B and 2A-2B, may be configured such that the base 130 exhibits a VTR having a substantially linear relation to the environmental temperature as communicated by the temperature of the heatsink 160.

A desirable response of a VTR, in example embodiments, is to effect a linear change in thermal resistance ($R_{th}$) in response to environmental temperature, while effecting a nonlinear response in thermal conductance ($1/R_{th}$), which is proportional to contact area. However, the capillary action of the channel carrying the working fluid may change the contact area between the device and the heatsink in a linear fashion, and the thermal resistance is inversely proportional to the contact area (the inverse of thermal resistance, thermal conductance, is linearly proportional to contact area).

Thus, in order to effect a linear change in thermal resistance, the properties of the channel may be modified along the length in a nonlinear fashion. Examining the nonlinear thermal conductance curve as shown in FIG. 3, the VTR response may be designed to have low, intermediate and high changes in thermal conductance with temperature at low, intermediate and high environmental temperatures, respectively. Low or small changes in thermal conductance can be effected by fluid movement in the capillary that is not directly under the device being regulated. Intermediate changes in thermal conductivity can be effected by fluid movement under the device. The surfaces in contact with the fluid can be low-thermal resistance silicon or high-thermal resistance silicon dioxide ($SiO_2$). The surfaces in contact with the fluid can be textured to modify the amount of surface area in contact with the fluid. By varying the proportion of the capillary surface that is silicon or $SiO_2$ along the length of the capillary, or varying the texture of the capillary surfaces along the length of the capillary, the rate of change can be varied. Further, in order to effect large changes in thermal conductance with temperature, silicon heat fins can be added to the capillary channel to enhance heat transfer to the substrate. Additional capillaries can also be introduced from other directions to further increase the contact area between the device and the heatsink. By combining one or more of the above approaches, the desired nonlinear thermal conductance curve (and linear thermal resistance curve) can be closely approximated.

Figure 4B:
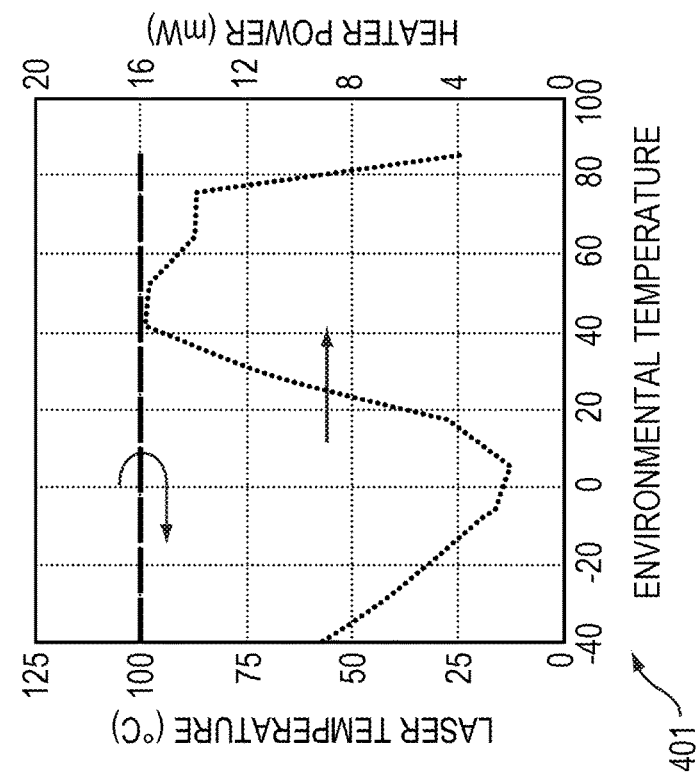
FIG. 4B is a graph illustrating device temperature and requisite heater power as a function of environmental temperature exhibited by an example embodiment.
Figure 4A:
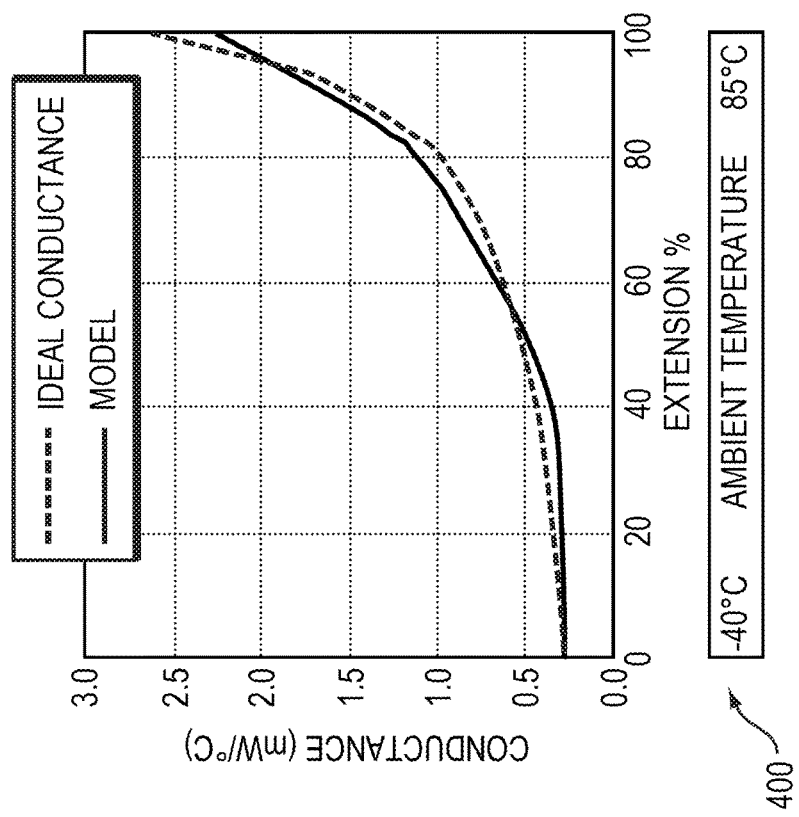
FIG. 4A is a graph illustrating thermal conductance as a function of thermal expansion exhibited by an example embodiment.

FIG. 4A is a graph 400 illustrating thermal conductance as a function of thermal expansion exhibited by an example embodiment. The thermal expansion is expressed as a percentage, where 0% corresponds to the position of the working fluid at the minimum expected environmental temperature (e.g., −40° C.), and 100% corresponds to the position of the working fluid at the maximum expected temperature (e.g., 85° C.). The ideal conductance, illustrated by the dotted line, is comparable to the conductance illustrated in FIG. 3. The apparatus 100 and the subassembly 101, as described above in FIGS. 1A-1B and 2A-2B, may be configured such that the base 130 exhibits a conductance as shown by the solid line, which closely matches the ideal conductance.

FIG. 4B is a graph 401 illustrating device temperature and the power draw of a heater applied to the device as a function of environmental temperature exhibited by an example embodiment. As shown, the device temperature maintains a steady operating temperature at 100° C. through the entire range of environmental temperatures. The VTR may change its thermal resistance by, for example, approximately 9× of over the temperature range of −40° C. to 85° C. Absent a VTR, a common device assembly may require over 350 mW of heater power. Due to a VTR enabling the device to maintain at least a portion of its waste heat (e.g., 40-mW), the heater (e.g., heater 122 in FIGS. 2A-B) is required to apply only a small amount of heat (e.g., 0-16 mW) to maintain the device at the operating temperature through the range of environmental temperatures. The apparatus 100 and the subassembly 101, as described above in FIGS. 1A-1B and 2A-2B, may be configured such that the device 120 maintains the operating temperature as shown, while the heater 122 applies a minimal amount of heat as shown.

Figure 5A:
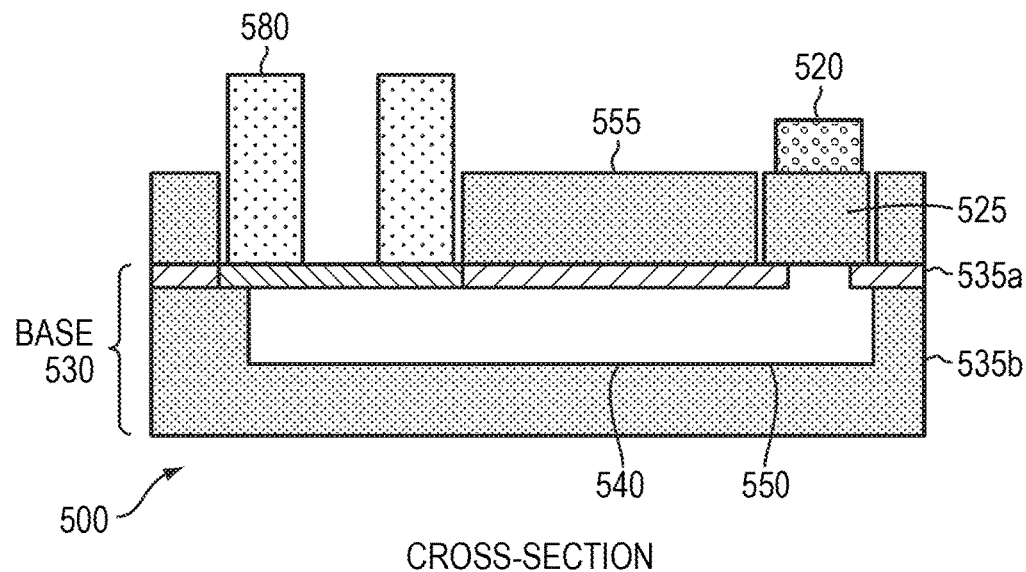
FIGS. 5A-B illustrate an apparatus in a further embodiment.
Figure 5B:
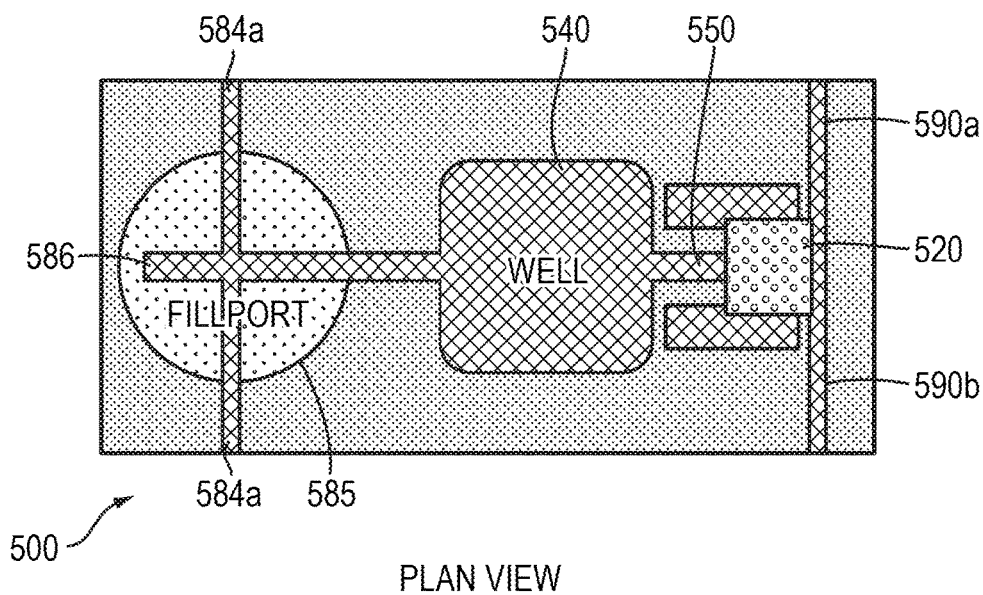

FIGS. 5A-B illustrate an apparatus 500 in a further embodiment. The apparatus 500 includes a device 520, a mount 525, and base 530 that may comprise features comparable to those of the apparatus 100 and the subassembly 101 as described above in FIGS. 1A-1B and 2A-2B. In particular, the base 530 may include an upper substrate layer 535*a* and a lower substrate layer 535*b* that encompass an internal volume 555, which may be divided into a well 540 and a channel 550.

Further, the apparatus 500 may include additional features for introducing and managing a working fluid, such as the working fluid 170 described above. A fill port 585 includes an aperture in the substrate 535 into which a fill tube 580 may be inserted. Through the fill tube 580, a working fluid (not shown) may be introduced into the fill channel 586. The fill channel 586 may be in liquid communication with the well 540, enabling the working fluid to be transferred into the well 540. The fill channel 586 may be configured to function as a one-way valve, preventing the working fluid in the well 540 from returning to the fill channel 586. In order to transfer the working fluid through the fill channel 586, the working fluid may be applied with pressure to the fill port 585. To prevent damage to the apparatus 500 due to excess fluid or the pressurized application, fill vents 584*a-b* may connect to the fill channel 586 to expel any excess fluid when the working fluid exceeds a threshold pressure. Likewise, channel vents 590*a-b* may connect to the channel 550 and expel a portion of the working fluid when the pressure of the working fluid in the channel 550 exceeds a given threshold. The channel vents 590*a-b*, as shown, extend to respective edges of the apparatus 500, and may have open ends to expel a portion of the working fluid away from the apparatus 500. Alternatively, the channel vents 590*a-b* may be defined to maintain the working fluid within the apparatus 500. To do so, the channel vents 590*a-b* may extend through further lengths within the base 530 in order to accommodate a greater volume of the working fluid. In further embodiments, vents such as the fill vents 584*a-b* and channel vents 590*a-b* can be configured to serve a number of functions, including 1) providing a path for air to escape from the capillary as the capillary is filled with fluid, thereby preventing pressurization of the capillary with trapped air; 2) providing a vent at the junction between the well and the narrow-neck fill port to facilitate separation of the fluid at the narrow neck between the supply and well when fluid fill pressure is reduced to halt filling of the well and capillary; and 3) a "pressure-relief" valve in to which fluid may expand as a result of excessive temperature.

The fill channel 586 may have a smaller diameter than well 540 such that the capillary pressure of the working fluid in the well is lower than that of the fill channel. Thus working fluid will not re-enter the fill channel after passing into the well. During the filling process, the working fluid enters the fill channel only when pressurized from an external fill apparatus (not shown). When the fill apparatus removes the external pressure, the working fluid is expelled from the fill channel 586, but the fluid in the well 540 is retained in the well, having insufficient pressure to re-enter the smaller fill channel. At the conclusion of the fill process, the fluid in the well 540 may separate from the fluid in the fill port.

Figure 5C:
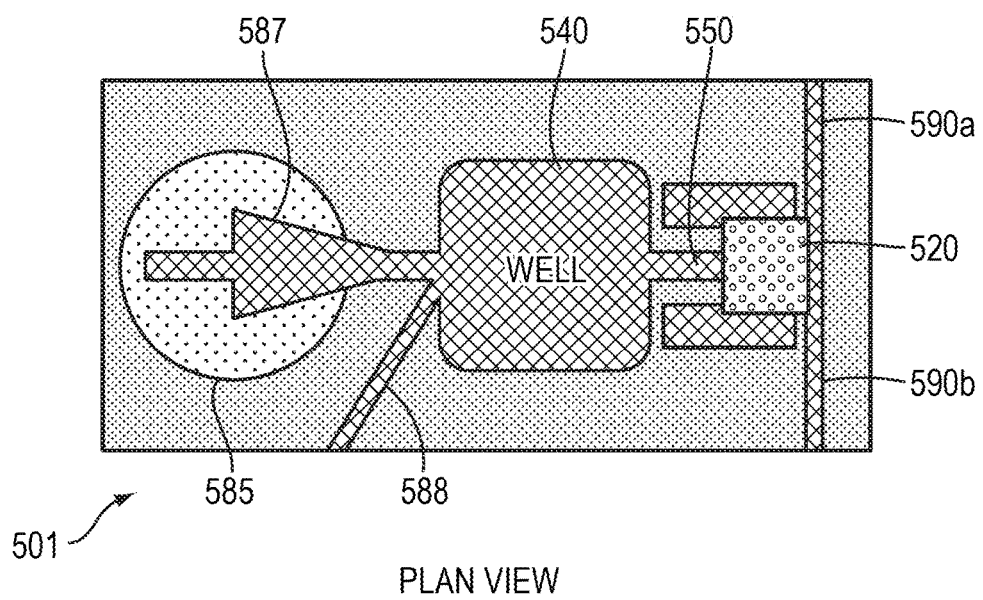
FIG. 5C illustrate an apparatus in a still further embodiment.

FIG. 5C illustrates an apparatus 501 in a further embodiment. The apparatus 501 may include some or all features of the apparatus 500 described above, and further includes a tapered fill port 587 and a fill vent 588. The tapered fill channel 587 may have a smaller diameter at the well 540 and a larger diameter towards the fill port 585. As the separation of the two volumes of fluid will occur at the narrowest portion of the capillary, the separation process is highly reproducible, accurately and repeatably filling a well with a consistent volume of fluid. The fill vent 588 may be connected to the narrowest point in the tapered fill channel 587 to supply air that to back-fill the fill channel 587 as the working fluid retracts into the fill apparatus, preventing a low-pressure vacuum that would retain fluid in the fill port 585.

Temperature-sensitive devices that must operate in a power-constrained environment of changing temperature would benefit from a variable thermal resistance. In example embodiments, such as those described above, a mercury-capillary that expands and contracts under the influence of environmental temperature can passively regulate a device's temperature by increasing or decreasing the device's contact with a heatsink. A mercury capillary fabricated by lithographic techniques on the surface of a silicon wafer, and the mercury-capillary VTR can mediate contact to a heatsink, changing thermal resistance by ~9×, resulting in ~20× reduction in the amount of power required for temperature regulation of a device, such as a diode laser, when the environmental temperature varies from −40° C. to 85° C.

While this invention has been particularly shown and described with references to example embodiments thereof, it will be understood by those skilled in the art that various changes in form and details may be made therein without departing from the scope of the invention encompassed by the appended claims.

What is claimed is:

1. An apparatus for regulating temperature, comprising:
   a mount configured to accept a device on a surface thereon;
   a heatsink; and
   a base defining a well therein configured to contain a working fluid and defining a channel disposed in a thermally conductive path between the mount and the heatsink, the channel in liquid communication with the well, the well and channel being sized to enable the working fluid to expand passively from the well into the channel and contract passively from the channel into the well in continuous amounts, the amounts being a function of a temperature of the heatsink.

2. The apparatus of claim 1, wherein the thermally conductive path has a thermal resistance that varies in a substantially linear relation to the temperature of the heatsink, the thermal resistance being a function of the amount of working fluid in the channel.

3. The apparatus of claim 2, wherein the thermal resistance of the thermally conductive path varies in a manner enabling the mount to maintain a substantially constant temperature while the temperature of the heatsink fluctuates.

4. The apparatus of claim 1, wherein the heatsink is further configured to absorb heat from or conduct heat to an external environment, the temperature of the heatsink varying based on a temperature of the external environment.

5. The apparatus of claim 1, wherein the working fluid possesses a higher positive coefficient of thermal expansion than the base at least at the well and channel.

6. The apparatus of claim 5, wherein the coefficient of thermal expansion of the working fluid is at least 1% relative to a thermal resistance of the base over a temperature range of −40° C. to 85° C.

7. The apparatus of claim 1, further comprising a support structure disposed in the thermally conductive path and coupled to the mount, the support structure having a high thermal resistance relative to a thermal resistance of the working fluid.

8. The apparatus of claim 7, wherein the mount and heatsink are thermally isolated but for the support structure and the channel.

9. The apparatus of claim 7, wherein the support structure is configured to form walls of at least two sides of the channel.

10. The apparatus of claim 1, further comprising an enclosure containing the mount and the device within an internal volume, the internal volume having a high thermal resistance relative to a thermal resistance of the working fluid.

11. The apparatus of claim 1, wherein the base further defines a vent in liquid communication with the channel, the vent being configured to receive a portion of the working fluid in response to the working fluid crossing a threshold pressure within the channel.

12. The apparatus of claim 1, wherein the channel is at least partially unbounded on at least two sides, the channel maintaining the working fluid within the at least two sides based on a surface tension of the working fluid.

13. The apparatus of claim 1, wherein the base defines the channel as a plurality of branches extending from the well, each of the branches being configured to receive a portion of the working fluid concurrently.

14. The apparatus of claim 1, wherein the mount and base are produced by a Microelectromechanical systems (MEMS) manufacturing process.

15. The apparatus of claim 1, further comprising a heater device configured to selectively apply heat to the device based on a detected temperature of the device.

16. The apparatus of claim 1, wherein at least one of the base and the mount are sized to exhibit a gradient of thermal resistance, the gradient having a direction parallel to a length of the channel.

17. The apparatus of claim 1, further comprising a fill port in liquid communication with the well, the fill port being configured to receive the working fluid from an external source and direct the working fluid into the well.

18. The apparatus of claim 1, further comprising an electro-wetting capillary pump configured to assist expansion of the working fluid from the well into the channel.

19. An apparatus for regulating temperature, comprising:
    a mount;
    a heatsink; and
    a base defining a passive capillary and well system thermally disposed between the mount and heatsink and containing therein a working fluid that variably thermally couples the mount to the heatsink as a function of a temperature of the heatsink and enables the mount to maintain a substantially constant temperature while the heatsink fluctuates as a function of its surrounding environment.

20. A method of regulating temperature, comprising:
    storing a working fluid in a well;
    enabling the working fluid to expand from the well into a channel in response to an increase in a temperature of a heatsink, the channel being disposed in a thermally conductive path between a mount and the heatsink, the channel receiving an amount of the working fluid as a function of the temperature of the heatsink; and
    enabling the working fluid to contract from the channel into the well in response to a decrease in the temperature of the heatsink.

21. The method of claim 20, wherein enabling the working fluid to expand and contract causes the thermally conductive path to have a thermal resistance that varies in a substantially linear relation to the temperature of the heatsink.

22. The method of claim 20, wherein enabling the working fluid to expand and contract causes the thermally conductive path to have a thermal resistance that varies in a manner causing the mount to maintain a substantially constant temperature while the temperature of the heatsink fluctuates.

23. The method of claim 20, wherein the heatsink absorbs heat from or conducts heat to an external environment, the temperature of the heatsink varying based on a temperature of the external environment.

24. The method of claim 20, wherein the working fluid possesses a higher positive coefficient of thermal expansion than a base that defines the well and channel.

25. The method of claim 24, wherein the coefficient of thermal expansion is at least 1% over a temperature range of −40° C. to 85° C.

26. The method of claim 20, further comprising thermally isolating the mount and the heatsink but for the thermally conductive path.

27. The method of claim 20, further comprising enclosing the mount and the device within an internal volume, the internal volume having a high thermal resistance relative to a thermal resistance of the working fluid.

28. The method of claim 20, further comprising enabling the working fluid to enter a vent in response to the working fluid crossing a threshold pressure within the channel.

29. The method of claim 20, wherein at least one of the base and the mount are sized to exhibit a gradient of thermal resistance, the gradient having a direction parallel to a length of the channel.

30. An apparatus for regulating temperature, comprising:
means for storing a working fluid in a well; and
means for enabling the working fluid to expand from the well into a channel in response to an increase in a temperature of a heatsink and contract from the channel into the well in response to a decrease in the temperature of the heatsink, the channel being disposed in a thermally conductive path between a mount and the heatsink, the channel receiving an amount of the working fluid as a function of the temperature of the heatsink.

31. A method of manufacturing an apparatus for regulating temperature, comprising:
forming, within a substrate:
a mount configured to be coupled to a device;
a well configured to contain a working fluid; and
a channel formed to be disposed in a thermally conductive path between the mount and a heatsink, the channel in liquid communication with the well, the channel and well being sized to enable the working fluid to expand passively into the channel and contract passively from the channel in continuous amounts, the channel receiving an amount of the working fluid as a function of a temperature of the heatsink.

32. The method of claim 31, further comprising forming a fill port in liquid communication with the well, the fill port being configured to receive the working fluid from an external source and direct the working fluid into the well.

33. The method of claim 31, further comprising lining at least some surfaces of the well and channel with a layer that is nonreactive relative to the working fluid.

34. A product prepared by a process comprising:
forming a mount within a substrate;
forming a well within the substrate;
filling the well with a working fluid; and
forming a channel within the substrate, the channel disposed in a thermally conductive path between the mount and a heatsink, the channel in liquid communication with the well, the channel and well being sized to enable the working fluid to expand passively into the channel and contract passively from the channel in continuous amounts, the channel receiving an amount of the working fluid as a function of a temperature of the heatsink.

35. The product of claim 34, further comprising forming a fill port in liquid communication with the well, the fill port being configured to receive the working fluid from an external source and direct the working fluid into the well.

* * * * *